Dec. 12, 1972 R. TENENHOLTZ 3,706,042

BALANCED MIXER

Filed Dec. 11, 1970

PHASE DIAGRAM

| OUTPUT TERMINAL | INPUT TO OUTPUT | | | OUTPUT TO INPUT | | | | | | | |
|---|---|---|---|---|---|---|---|---|---|---|---|
| | $f_S$ | $f_L$ | $f_S$-$f_L$ | $f_S$20 | $f_S$21 | $f_S$22 | $f_S$23 | $f_L$20 | $f_L$21 | $f_L$22 | $f_L$23 |
| 40A | 0° | −90° | +90° | 0° | −90° | −90° | 180° | −90° | 180° | 180° | +90° |
| 41A | −90° | 0° | −90° | 180° | +90° | −90° | 180° | −90° | 180° | 0° | −90° |
| 42A | −90° | 180° | +90° | 180° | −90° | +90° | 180° | +90° | 180° | 0° | +90° |
| 43A | 180° | −90° | −90° | 0° | +90° | +90° | 180° | +90° | 180° | 180° | −90° |

INVENTOR
Robert Tenenholtz
BY Wolf, Greenfield & Sacks
ATTORNEYS

United States Patent Office 3,706,042
Patented Dec. 12, 1972

3,706,042

BALANCED MIXER

Robert Tenenholtz, Framingham, Mass., assignor to Sage Laboratories, Inc., Natick, Mass.

Filed Dec. 11, 1970, Ser. No. 97,196
Int. Cl. H04b 1/26
U.S. Cl. 325—446 7 Claims

ABSTRACT OF THE DISCLOSURE

One disclosed embodiment of the invention is a balanced mixer which receives an input signal and a local oscillator signal, and generates an intermediate frequency output signal. The input signal is coupled to one port of a first quadrature hybrid while the local oscillator signal is coupled to one port of a second quadrature hybrid. The outputs of these quadrature hybrids are interconnected to first and second quadrature hybrid mixers each including a pair of oppositely poled diodes. The output of these quadrature hybrid mixers are intercoupled to an output terminal to provide the intermediate frequency output signal.

BACKGROUND OF THE INVENTION

The present invention relates in general to high frequency signal combining and more particularly concerns a novel apparatus for combining high frequency and local oscillator signals to generate an intermediate frequency signal with exceptionally low noise figure, high isolation between local oscillator and signal inputs, low VSWR, and local oscillator noise cancellation.

Balanced mixers have been widely used for either down conversion of microwave signals to an intermediate frequency, or alternatively for up conversion of an IF signal and a local oscillator signal to a microwave frequency signal. In constructing these devices isolation between the local oscillator and the signal inputs, and local oscillator noise cancellation are significant parameters. Also, it is usually desirable to have as low a VSWR as possible.

One such signal combining apparatus is disclosed in U.S. Pat. 3,532,989 issued Oct. 6, 1970. and assigned to the same assignee as the present invention. The apparatus disclosed in this copending application comprises a single input hybrid means and a pair of output hybrid mixers. The arrangement provides a low VSWR and improved isolation. However, for some applications, particularly those requiring broadband operation, the device does not provide adequate isolation particularly between the signal and local oscillator inputs.

Accordingly, it is an important object of the present invention to provide an improved balanced mixer that is capable of providing an intermediate frequency signal with exceptionally low noise figure, and is also capable of providing a high degree of isolation between the local oscillator and signal inputs, and low VSWR at both local oscillator and signal inputs.

It is a further object of the present invention to provide a balanced mixer circuit that provides both local oscillator noise cancellation at the signal input port, and signal noise cancellation at the local oscillator input port.

It is another object of the present invention to provide a balanced mixer for combining local oscillator and input signals to provide an IF signal of lower frequency, characterized by low VSWR at both local oscillator and signal inputs, and good isolation between local oscillator and signal inputs over multi-octave frequency ranges.

Still another object of the present invention is to provide a balanced modulator or down converter that combines a local oscillator signal and an intermediate frequency signal and generates a high frequency microwave output signal, and is further characterized by low VSWR and good isolation between local oscillator and modulating (IF) signals.

SUMMARY OF THE INVENTION

According to the invention, there is provided a first and second hybrid means and first and second hybrid mixers. Each hybrid means has first, second, third and fourth signal ports. Each hybrid may be a quadrature hybrid and has the property that when the ports of the hybrid are properly terminated in their respective characteristic impedance, each first port is effectively isolated from each second port and each third port is effectively isolated from each fourth port so that energy applied to a first port divides substantially equally between the third and fourth ports with virtually no energy reaching a second port, and energy applied to a second port divides substantially equally between the third and fourth ports with virtually no energy reaching the first port.

A first pair of unilaterally conducting devices is coupled to the third and fourth ports, respectively, of the first hybrid mixer while a second pair of unilaterally conducting devices is coupled to the third and fourth ports, respectively, of the second hybrid mixer. Means are also provided for coupling the third port of the first hybrid means to the first port of the first hybrid mixer. Similarly, the fourth port of the first hybrid means is coupled to the first port of the second hybrid mixer. Means are provided for coupling the third port of the second hybrid means to the second port of the first hybrid mixer. Similarly, means are provided for coupling the fourth port of the second hybrid means to the second port of the second hybrid mixer.

In one embodiment opposite electrodes of each pair of unilaterally conducting devices are intercoupled. The intercoupled electrodes of both pairs are then connected to a common output terminal at which an intermediate frequency output signal is generated. When the local oscillator and input signals are coupled to respective ones of the input hybrid means first ports, respectively, an IF signal corresponding to the difference between the frequencies of the input signal and the local oscillator signal is provided on the common output terminal.

In another embodiment of the invention an up converter or balanced modulator is disclosed. In this embodiment a pair of input hybrid means and a pair of hybrid mixers are interconnected as discussed above. However, the unilaterally conducting devices of each pair are interconnected so that the devices of each pair are poled in a like sense.

Numerous other features, objects and advantages of the invention will now become apparent upon the reading of the following detailed description in conjunction with the accompanying drawings:

DETAILED DESCRIPTION OF THE INVENTION

Figures 1, 2, 3:
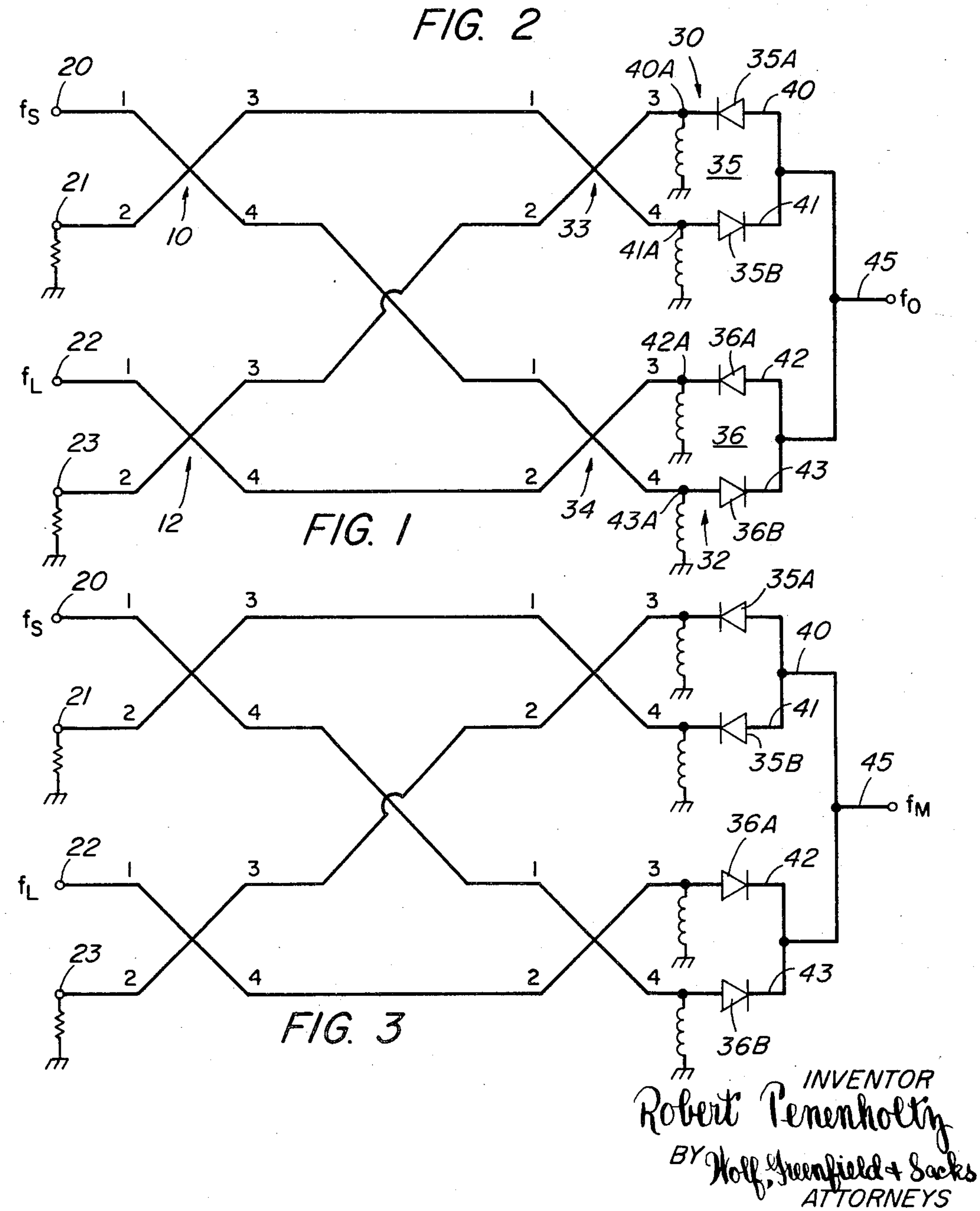
FIG. 1 is a schematic diagram of a high frequency signal combining apparatus according to the invention.
FIG. 2 is a table that indicates phased relationships associated with the apparatus of FIG. 1.
FIG. 3 is another embodiment of the invention intercoupled to provide a suppressed carrier double sideband modulator, according to the invention.

Referring now to FIG. 1 there is shown a schematic diagram of a balanced mixer according to the invention. The mixer comprises first and second input quadrature hybrids 10 and 12, respectively. Both hybrids 10 and 12 are depicted as including four ports labeled as input ports 1 and 2 and output ports 3 and 4. Port 1 of hybrid 10 is coupled from the input terminal 20. The input signal of frequency $f_S$ is coupled to input terminal 20. Input terminal 21 is coupled to port 2 of hybrid 10 and is conventionally terminated by the appropriate resistance to ground.

Similarly, port 1 of hybrid 12 couples to terminal 22, to which the local oscillator signal $f_L$ is coupled. Port 2 of hybrid 12 is coupled to terminal 23 which is conventionally terminated by the appropriate resistance to ground. Both ports 21 and 23 should be terminated in the characteristic impedance of their respective hybrids.

In the embodiment of FIG. 1 conventional quadrature hybrids may be used. Each of these hybrids 10 and 12 may comprise a Sage type No. 751 Temline hybrid or the like. Each of the hybrids has the property that when the port 20, for example, is terminated at terminal 21, the first port is effectively isolated from the fourth port, so that energy applied to a first port divides substantially equally between the third and fourth ports with virtually no energy reaching the second port, and energy applied to the second port divides substantially equally between the third and fourth ports with virtually no energy reaching the first port. Also, the $f_S$ signal coupled to input port 1 of hybrid 10 would experience a zero phase change at port 3 and a —90° phase change at port 4 of the same hybrid. Similarly, with respect to hybrid 12 any signal coupled by way of terminal 22 to input port 1 would show a zero phase change at output port 3 and a —90° phase change at port 4 of hybrid 12.

The signal combining apparatus of FIG. 1 also comprises output quadrature hybrid mixers 30 and 32. These mixers 30 and 32 may comprise conventional quadrature hybrids 33 and 34, respectively, which may be the same type hybrids as hybrids 10 and 12. Hybrids 33 and 34 each include ports 1, 2, 3 and 4. The hybrid mixers 30 and 32 also comprise output diode pairs 35 and 36, respectively. Diode pair 35 includes oppositely poled diodes 35A and 35B whereas diode pair 36 includes oppositely poled diodes 36A and 36B. FI1. 1 also shows conventional DC return inductances coupled from each of the ports 3 and 4 of both hybrids 33 and 34.

In order to provide the correct phase relationships between the input microwave signals and the intermediate frequency signal, the output port 3 of input hybrid 12 is coupled to the input port 2 of hybrid 33. Similarly, the output port 4 of hybrid 10 is coupled directly to the input port 1 of hybrid 34. The intermeditae frequency signal is generated on output line 45 which is coupled by way of line 40 to the anode of dioide 35A, by way of line 41 to the cathode of diode 35B, by way of line 42 to the anode of diode 36A, and by way of line 43 to the cathode of diode 36B.

For a better understanding of the isolation provided by the circuit of FIG. 1, attention is directed to the diagram of FIG. 2. In FIG. 2 it is assumed that the signals $f_S$ and $f_L$ applied to input terminals 20 and 22, respectively, are at a zero phase angle. The corresponding phase relationships of both of these signals at the terminals 40A, 41A, 42A and 43A are shown. FIG. 2 also indicates the phase relationships of $f_S$–$f_L$ at these terminals. The rest of the diagram indicates the phase relationships of the reflected signals from all four of these terminals 40A–43A to each of the input terminals 20, 21, 22 and 23 assuming all diodes exhibit similar properties with respect to reflection coefficient, as is the case with many known diodes.

FIG. 2 also shows the phase relationships of the $f_S$ and $f_L$ signals that may be reflected to the input terminals 20–23. These phase relationships indicate that the $f_S$ signals reflected to input terminals 20, 21 and 22 have a cancelling effect.

Similarly, FIG. 2 also indicates that the phase relationships reflected with reference to the local oscillator signal $f_L$ exhibits a cancellation effect particularly at terminals 20, 22 and 23. A good impedance match is provided between terminals 22 and 23 providing a good termination for the local oscillator signal. Good isolation is provided between the local oscillator signal $f_L$ and the $f_S$ signal and a low VSWR is provided between these two terminals 20 and 22.

The particular arrangement shown in FIG. 1 has been operated over octave bandwidths and has provided excellent isolation. The four hybrids 10, 12, 33 and 34 shown in FIG. 1 in themselves provide a certain degree of isolation. However, they cannot be constructed ideally and in addition, diodes don't exhibit a perfect VSWR in practice. Thus the arrangement shown in FIG. 1 aids in providing added isolation and a lower VSWR than was attainable with other known mixer configurations.

In one embodiment in accordance with the invention 20 db isolation isolation was obtained. This particular embodiment was operated over a frequency range of 2 to 4 gHz.

Referring now to FIG. 3 there is shown another embodiment of the invention constructed to operate as a suppressed carrier double sideband modulator. The embodiment of FIG. 3 is identical to that of FIG. 1 except that the diodes, which are similary labeled 35A, 35B, 36A, 36B are poled in the same sense. In other words, the output line 45 connects by way of lines 40, 41, 42 and 43, to the anodes of diodes 35A and 35B, and to the cathodes of diodes 36A and 36B, respectively. In this arrangement a signal (low frequency) is applied to line 45 along with a local oscillator signal at terminal 22. The output is generated at terminal 20 and may be referred to as an $f_S$ output signal which in the embodiments of FIG. 3 represents a sum signal of $f_L+f_M$. The embodiment of FIG. 3 provides excellent isolation and a low VSWR.

What is claimed is:

1. High frequency signal combining apparatus comprising:

first and second input quadrature hybrid means each having first, second, third and fourth ports with said first port isolated from said second port and said third port isolated from said fourth port when each port is terminated in its respective characteristic impedance, first and second output quadrature hybrid means each having first, second, third and fourth ports with said first port isolated from said second port and said third port isolated from said fourth port when each port is terminated in its respective characteristic impedance, means for coupling the third port of said first input quadrature hybrid means to the first port of said first output quadrature hybrid means, means for coupling the fourth port of said first input quadrature hybrid means to the first port of said second output quadrature hybrid means, means for coupling the third port of said second input quadrature hybrid means to the second port of said first output quadrature hybrid means, means for coupling the fourth port of said second input quadrature hybrid means to the second port of said second output quadrature hybrid means, a first pair of unilaterally conducting devices each having anode and cathode electrodes, being oppositely poled, each having one electrode coupled to the third and fourth ports respectively of said first output quadrature hybrid means, the opposite electrodes of both devices being intercoupled, a second pair of unilaterally conducting devices each having anode and cathode electrodes, being oppositely poled, each having one electrode coupled to the third and fourth ports respectively of said second output quadrature hybrid means, the opposite electrodes of both devices being intercoupled, and means coupling between the intercoupled electrodes of said first pair and said second pair of unilaterally conducting devices.

2. High frequency signal combining apparatus in accordance with claim 1 and comprising means for terminating the second ports of both said first and second input quadrature hybrid means in their respective characteristic impedance, the first port of said first input quadrature hybrid means having means for coupling an input signal thereto and the first port of said second input quadrature hybrid means having means for coupling a local oscillator signal thereto.

3. High frequency signal combining apparatus comprising:

first and second input quadrature hybrid means each having first, second, third and fourth ports with said first port isolated from said second port and said third port isolated from said fourth port when each port is terminated in its respective characteristic impedance, first and second output quadrature hybrid means each having first, second, third and fourth ports with said first port isolated from said second port and said third port isolated from said fourth port when each port is terminated in its respective characteristic impedance, means for coupling the third port of said first input quadrature hybrid means to the first port of said first output quadrature hybrid means, means for coupling the fourth port of said first input quadrature hybrid means to the first port of said second output quadrature hybrid means, means for coupling the third port of said second input quadrature hybrid means to the second port of said first output quadrature hybrid means, means for coupling the fourth port of said second input quadrature hybrid means to the second port of said second output quadrature hybrid means, a first pair of unilaterally conducting devices each having anode and cathode electrodes, being poled in the same sense and having like electrodes coupled to the third and fourth ports respectively of said first output quadrature hybrid means, the other like electrodes of both devices being intercoupled, a second pair of unilaterally conducting devices each having anode and cathode electrodes, being poled in the same sense and having like electrodes coupled to the third and fourth ports respectively of said second output quadrature hybrid means, the other like electrodes of both devices being intercoupled, and means coupling between the intercoupled electrodes of said first pair and said second pair of unilaterally conducting devices.

4. High frequency signal combining apparatus in accordance with claim 3 wherein the intercoupled like electrodes of said first pair of unilaterally conducting devices are of the opposite type to the intercoupled like electrodes of said second pair of unilaterally conducting devices.

5. High frequency signal combining apparatus in accordance with claim 4 wherein said means coupling between the intercoupled electrodes includes means for coupling a lower frequency input signal thereto, the first port of said second input quadrature hybrid means having means for coupling a local oscillator signal thereto.

6. High frequency signal combining apparatus in accordance with claim 4 wherein the anodes of said first pair are intercoupled and the cathodes of said second pair are intercoupled.

7. High frequency signal combining apparatus in accordance with claim 3 and comprising means for terminating the second ports of both said first and second input quadrature hybrid means in their respective characteristic impedances.

References Cited

UNITED STATES PATENTS

| | | | |
|---|---|---|---|
| 3,515,993 | 6/1970 | Merriam | 325—446 |
| 3,532,989 | 10/1970 | Saad | 325—445 |
| 3,512,090 | 5/1970 | Mouw | 325—442 |

ROBERT L. GRIFFIN, Primary Examiner

B. L. LEIBOWITZ, Assistant Examiner